United States Patent
Fujinami et al.

(10) Patent No.: US 8,592,004 B2
(45) Date of Patent: Nov. 26, 2013

(54) FILM DEPOSITION METHOD

(75) Inventors: Tatsuya Fujinami, Kanagawa (JP);
Shinsuke Takahashi, Kanagawa (JP);
Jun Fujinawa, Kanagawa (JP); Kouji Tonohara, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 609 days.

(21) Appl. No.: 12/880,615

(22) Filed: Sep. 13, 2010

(65) Prior Publication Data

US 2011/0064890 A1   Mar. 17, 2011

(30) Foreign Application Priority Data

Sep. 11, 2009   (JP) ................. 2009-210738

(51) Int. Cl.
*C23C 16/458* (2006.01)
(52) U.S. Cl.
USPC ...................... 427/569; 427/248.1
(58) Field of Classification Search
None
See application file for complete search history.

(56) References Cited

U.S. PATENT DOCUMENTS

| | | |
|---|---|---|
| 6,096,389 A | 8/2000 | Kanai |
| 2006/0159844 A1 | 7/2006 | Moriwaki et al. |
| 2008/0102222 A1 | 5/2008 | Fujinawa et al. |

FOREIGN PATENT DOCUMENTS

| | | |
|---|---|---|
| EP | 1 889 947 | 2/2008 |
| JP | 2000-239849 | 9/2000 |
| JP | 2004-095677 | 3/2004 |
| JP | 2004-95677 | 3/2004 |

OTHER PUBLICATIONS

Kusada, JP2000-239849,Sep. 2000, Eng machine translation.*
Applicant response to European Office Action, Sep. 2011.*
European Search Report—EP 10 17 4110—Nov. 9, 2010.

* cited by examiner

*Primary Examiner* — Joseph Miller, Jr.
(74) *Attorney, Agent, or Firm* — Young & Thompson (57) ABSTRACT

A film deposition method deposits a film on a surface of a substrate in strip form traveling on a peripheral surface of a cylindrical drum in at least one film deposition compartment around the peripheral surface of the drum. The method disposes previously a differential compartment between one film deposition compartment and a compartment including a wrapping space containing at least one of a first position at which the substrate starts to travel on the drum and a second position at which the substrate separates from the drum, the differential compartments communicating with the compartment including the wrapping space and the film deposition compartment, sets a first pressure of the wrapping space lower than a second pressure of the at least one film deposition compartment and performs film deposition in the film deposition compartment with electric power supplied to the drum.

12 Claims, 3 Drawing Sheets

FILM DEPOSITION METHOD

BACKGROUND OF THE INVENTION

The present invention relates to a film deposition method suitable to produce functional films.

Various functional films (functional sheets) including gas barrier films, protective films, and optical films such as optical filters and antireflection films are used in various devices including optical devices, display devices such as liquid crystal display devices and organic EL display devices, semiconductor devices, and thin-film solar batteries.

These functional films have been produced by film formation (thin film formation) through vacuum deposition techniques such as sputtering and plasma-enhanced CVD.

Continuous deposition of a film on an elongated substrate is preferred for efficient film formation with high productivity by a vacuum deposition technique.

A typical film deposition device known in the art for conducting such film formation is a roll-to-roll film deposition device using a feed roll having an elongated substrate (a web of substrate) wound into a roll and a take-up roll in which the substrate having a film formed thereon is wound into a roll. This roll-to-roll film deposition device continuously forms a film on the elongated substrate in a film deposition compartment as the substrate travels from the feed roll to the take-up roll on a predetermined path including the film deposition compartment for depositing a film on the substrate, with the substrate fed from the feed roll in synchronism with the winding of the substrate having the film formed thereon on the take-up roll.

As such a roll-to-roll film deposition device, a device is also known in which a cylindrical drum is provided in a vacuum chamber, film deposition means such as an electrode and a reactive gas supply means are provided at positions facing the peripheral surface of the drum, and film deposition is continuously performed by the film deposition means as a substrate is traveling on the peripheral surface of the drum.

For example, JP 2004-95677 A describes a substrate treatment device which includes a feed roll (delivering roll) for feeding a flexible substrate to treatment compartments, the treatment compartments where the surface of the fed substrate is treated and a take-up roll on which the treated substrate is wound, and in which a drum (pass roll) is provided to make the substrate pass through the treatment compartments while contacting the peripheral surface of the drum, the treatment compartments are disposed in a circumferential direction of the drum, and differential compartments (differential evacuation compartments) are provided so as to be adjacent to the treatment compartments and are evacuated.

JP 2000-239849 A describes a continuous plasma CVD in which a continuous substrate (flexible base) which is traveling along a rotary drum disposed in a vacuum chamber is exposed to plasmas including RF plasma from an RF generator and microwave plasma to continuously form a thin film. JP 2000-239849 A also describes that the RF generator connected to the rotary drum applies a bias potential to general the plasma, thereby performing film deposition by plasma-enhanced CVD.

SUMMARY OF THE INVENTION

In cases where film deposition is performed by plasma-enhanced CVD or other process, a high bias potential is preferably applied to the drum to continuously deposit a high-quality film on a web of substrate with high efficiency. In order to continuously form a higher-quality film in a consistent manner, it is particularly necessary to apply a potential to both of the drum and a film deposition electrode to increase the bias voltage between the drum and the film deposition electrode.

However, application of a potential to the drum as in JP 2000-239849 A causes abnormal discharge not only in a film deposition compartment but also in a space where a feed roll or a take-up roll is disposed (hereinafter referred to as "feed and take-up compartment" for the sake of convenience) in particular between the drum and each component such as a guide roller in the feed and take-up compartment. The abnormal discharge may cause damage to the substrate or the film deposition device, or destabilize the plasma formation for film deposition to deteriorate the quality of the film formed.

In order to prevent such defects from occurring, an electrically conductive earth plate is disposed in the vicinity of the drum in the feed and take-up compartment to suppress abnormal discharge from the drum. However, the earth plate for preventing abnormal discharge cannot be disposed at the position at which the substrate starts to travel on the drum and the position at which the substrate separates from the drum. Therefore, abnormal discharge from the drum still occurs, which may cause damage to the substrate or the film deposition device, or deteriorate the quality of the film formed.

The present invention has been accomplished with a view to solving the foregoing prior art problems and an object of the present invention is to provide a film deposition method capable of continuously depositing a high-quality film with high efficiency while preventing damage to the substrate and the film deposition device by suppressing abnormal discharge from the drum at the position at which the substrate starts to travel on the drum and the position at which the substrate separates from the drum even in cases where electric power is applied to the drum to perform film deposition as an elongated substrate travels in its longitudinal direction.

To achieve the above object, the present invention provides a film deposition method in which a film is deposited on a surface of a substrate in strip form traveling on a peripheral surface of a cylindrical drum, in at least one film deposition compartment which contains a space defined by using the peripheral surface of the drum, the method comprising the steps of: disposing previously a differential compartment between one film deposition compartment and a compartment including a wrapping space containing at least one of a first position at which the substrate starts to travel on the drum and a second position at which the substrate separates from the drum, the differential compartments communicating with the compartment including the wrapping space and at least one film deposition compartment; setting a first pressure of the wrapping space lower than a second pressure of at least one film deposition compartment; and performing film deposition in at least one film deposition compartment, with electric power supplied to the drum.

In the film deposition method of the invention as described above, the wrapping space contains preferably both of the first position at which the substrate starts to travel on the drum and the second position at which the substrate separates from the drum.

The earth plates which contain electrically conductive, grounded plates are preferably disposed in at least one film deposition compartment so as to face at least part of the peripheral surface of the drum except a film deposition space.

Preferably, the film deposition method further comprising the step of setting a third pressure of the differential compartments higher than the second pressure of at least one film deposition compartment.

The earth plates which contain electrically conductive, grounded plates are preferably disposed in the differential compartments so as to face at least part of the peripheral surface of the drum.

The inert gas is preferably introduced into the differential compartments.

The film is preferably deposited on the substrate by CVD in at least one film deposition compartment.

The first pressure of the wrapping space is preferably up to one-tenth the second pressure of at least one film deposition compartment.

The first pressure of the wrapping space is preferably up to 1 Pa.

Preferably, at least one of guide rollers for making the substrate travel on a predetermined travel path are disposed and a space between at least one of guide rollers and the drum, including the wrapping space has a lower pressure than at least one film deposition compartment.

Preferably, a wrapping compartment including at least one of guide rollers and the space between at least one of guide rollers and the drum, including the wrapping space are disposed and the wrapping compartment has a lower pressure than at least one film deposition compartment.

Preferably, a substrate roll for feeding the substrate, a take-up roll for winding up the substrate after the film deposition, two guide rollers respectively disposed between said substrate roll and said drum and between said take-up roll and said drum, for making the substrate travel on a predetermined travel path, and a feed and take-up compartment including the substrate roll, the take-up roll, the two guide rollers, and the wrapping space are disposed and the feed and take-up compartment has a lower pressure than at least one film deposition compartment.

Preferably, at least one film deposition compartment comprises a plurality of film deposition compartments and the first pressure of the wrapping space is lower than one of a plurality of film deposition compartments which has the lowest pressure.

In cases where film deposition is performed on an elongated substrate traveling on a drum in its longitudinal direction as electric power is applied to the drum, the present invention is capable of suppressing abnormal discharge from the drum into the feed and take-up compartment by providing differential compartments between the compartment including the space containing at least one of the position at which the substrate starts to travel on the drum and the position at which the substrate separates from the drum (i.e., wrapping space) and the film deposition compartment and setting the pressure in the wrapping space lower than that of the film deposition compartment. Accordingly, during the film deposition by plasma-enhanced CVD, for example, plasma formation for film deposition is prevented from destabilizing to reduce the quality of the film formed, or damage to the substrate or the film deposition device is also prevented from occurring, thus enabling a high-quality film to be continuously deposited with high efficiency.

DETAILED DESCRIPTION OF THE INVENTION

Next, the film deposition method of the present invention is described in detail by referring to the preferred embodiments shown in the accompanying drawings.

Figure 1:
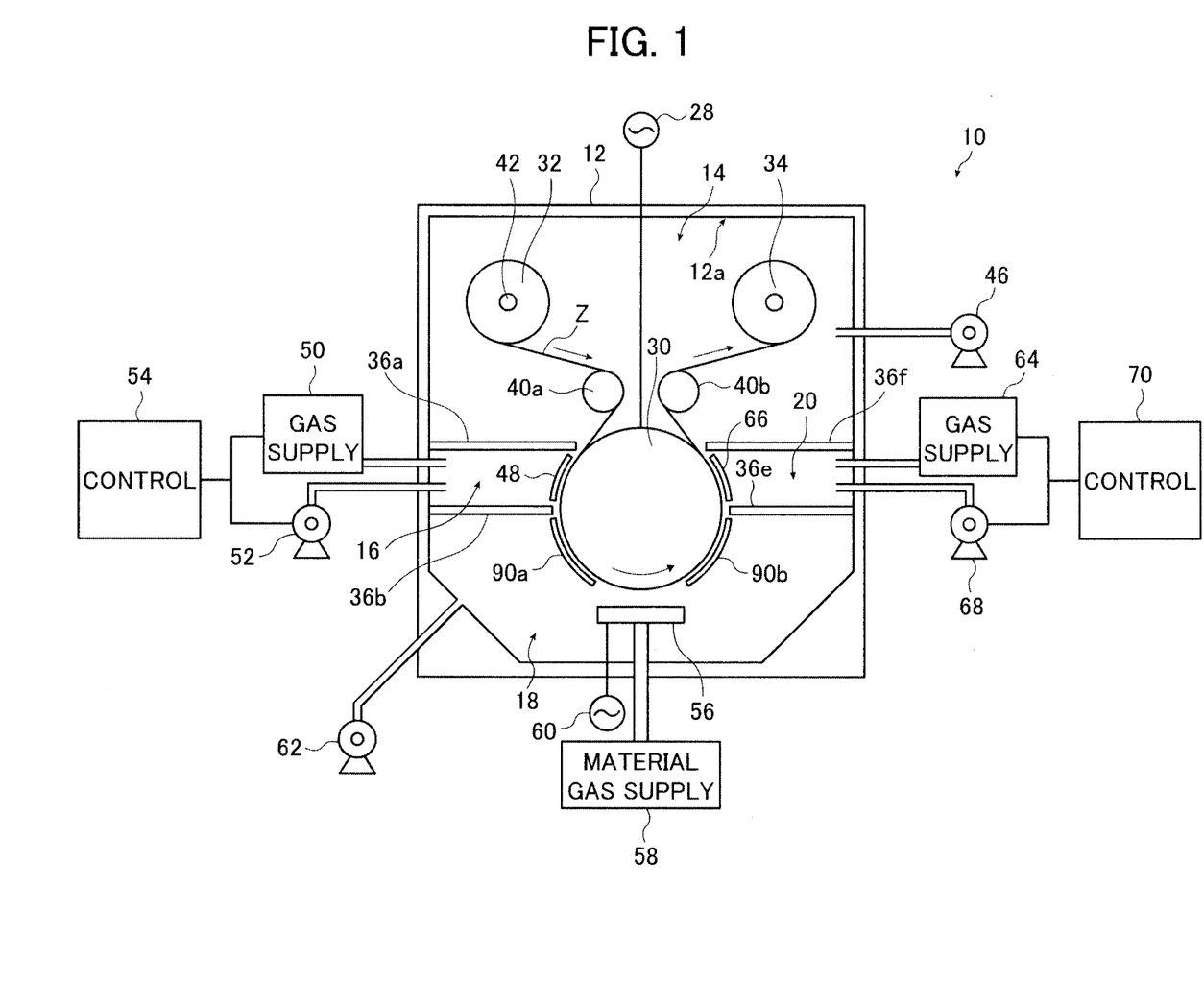
FIG. 1 is a schematic view showing an embodiment of a film deposition device for implementing the film deposition method of the present invention.

FIG. 1 is a schematic view showing an embodiment of a film deposition device for implementing the film deposition method of the present invention.

A film deposition device 10 shown in FIG. 1 is a device capable of film deposition on a substrate Z by plasma-enhanced CVD, and includes a vacuum chamber 12 as well as a feed and take-up compartment 14, a first differential compartment 16, a film deposition compartment 18, a second differential compartment 20 and a drum 30 formed in the vacuum chamber 12.

In the present invention, the substrate Z is not particularly limited but films (sheets) in strip form capable of CVD film formation as exemplified by resin films such as polyethylene terephthalate (PET) films and metallic films may be all employed.

A film obtained by forming layers for exhibiting various functions (e.g., planarizing layer, protective layer, adhesion layer, light-reflecting layer, antireflection layer) on a resin film serving as a base may be used for the substrate Z.

In the film deposition device 10, the substrate Z in strip form is fed from a substrate roll 32 of the feed and take-up compartment 14, travels on the drum 30 in its longitudinal direction and is subjected to film deposition in the film deposition compartment 18 before being rewound on a take-up shaft 34 in the feed and take-up compartment 14 (rewound into a roll (take-up roll)). That is to say, the feed and take-up compartment 14 is a compartment in which a virgin or unprocessed (non-deposited) substrate is uncoiled from the substrate roll 32 and fed to the drum 30, and a processed (deposited) substrate is coiled around the take-up shaft 34.

The drum 30 is a cylindrical member which rotates counterclockwise about the central axis in FIG. 1.

The drum 30 causes the substrate Z guided by a guide roller 40a of the feed and take-up compartment 14 to be described later along a predetermined path and held at a predetermined position in a predetermined region of the peripheral surface to travel in the longitudinal direction and sequentially pass through the first differential compartment 16, the film deposition compartment 18 and the second differential compartment 20 to reach a guide roller 40b of the feed and take-up compartment 14.

The drum 30 also serves as a counter electrode of a shower head electrode 56 in the film deposition compartment 18 to be described later and forms an electrode pair with the shower head electrode 56. A bias power source 28 is connected to the drum 30.

By applying a bias potential to the drum 30, material gas molecules and atoms supplied from a material gas supply means 58 and rendered into plasma by plasma excitation power supplied to the shower head electrode 56 can be attracted toward the drum 30 (substrate Z) during the film deposition in the film deposition compartment 18 to be described later in detail, which may therefore increase the density of the film formed on the substrate Z and improve the film quality and the film deposition efficiency.

The drum 30 may optionally be connected not only to the bias power source 28 but also to ground (grounding means) so as to be capable of switching between the connection to the bias power source 28 and grounding.

The drum 30 may also serve as a means for adjusting the temperature of the substrate Z during the film deposition in the film deposition compartment 18. Therefore, the temperature adjusting means is preferably built into the drum 30. The temperature adjusting means of the drum 30 is not particularly limited and various types of temperature adjusting means including one in which a refrigerant is circulated and a cooling means using a piezoelectric element may be all employed.

The bias power source 28 is an RF power source which supplies bias power to the drum 30.

Known power sources for applying bias power (e.g., RF power source and pulsed power source) employed in various film deposition devices may be all employed for the bias power source 28. The bias power supplied to the drum is not limited to RF power but may be DC power, or AC or DC pulsed power.

The bias power source 28 preferably supplies at least 100 W of bias power to the drum 30. At a bias power of at least 100 W, the quality of the film formed and the film deposition efficiency can be further improved and the film deposition method of the present invention capable of suppressing abnormal discharge from the drum 30 into the feed and take-up compartment 14 can be more advantageously used at a higher potential applied to the drum 30.

The feed and take-up compartment 14 is defined by an inner wall 12a of the vacuum chamber 12, the peripheral surface of the drum 30, and partition walls 36a and 36f extending from the inner wall 12a to the vicinity of the peripheral surface of the drum 30.

The ends of the partition walls 36a and 36f opposite from the inner wall 12a of the vacuum chamber 12 approach the peripheral surface of the drum 30 till the position where the ends do not come in contact with the traveling substrate Z to separate the feed and take-up compartment 14 from the first differential compartment 16 and the second differential compartment 20 in a substantially air-tight manner. In this regard, the same holds true for the other partition walls.

The feed and take-up compartment 14 includes the take-up shaft 34, the guide rollers 40a and 40b, a rotary shaft 42 and a vacuum evacuation means 46.

The guide rollers 40a and 40b are of an ordinary type guiding the substrate Z on the predetermined travel path. The take-up shaft 34 is of a known type for elongated sheets which winds up the substrate Z after the film deposition, and makes it the take-up roll.

In the illustrated case, the substrate roll 32 into which the substrate Z in strip form is wound is mounted on the rotary shaft 42. Upon mounting of the substrate roll 32 on the rotary shaft 42, the substrate Z is passed along the predetermined path including the guide roller 40a, the drum 30 and the guide roller 40b to reach the take-up shaft 34.

In the film deposition device 10, the substrate Z is fed from the substrate roll 32 in synchronism with the winding of the substrate Z having a film formed thereon on the take-up shaft 34, and film deposition is performed in the film deposition compartment 18 as the substrate Z in strip form travels on the predetermined travel path in the longitudinal direction.

The vacuum evacuation means 46 evacuates the feed and take-up compartment 14 so that the space containing the position at which the substrate Z starts to travel on the drum 30 and the position at which the substrate Z separates from the drum 30 may have a lower pressure than the pressure in the film deposition compartment 18 (film deposition pressure) or have a higher degree of vacuum than the film deposition compartment 18, and can thus prevent abnormal discharge from the drum 30 into the feed and take-up compartment 14 from occurring.

This point will be described later in further detail.

In the present invention, the vacuum evacuation means 46 is not particularly limited, and exemplary means that may be used include vacuum pumps such as a turbo pump, a mechanical booster pump, a rotary pump and a dry pump, an assist means such as a cryogenic coil, and various other known (vacuum) evacuation means which use a means for adjusting the ultimate degree of vacuum or the amount of air discharged and are employed in vacuum deposition devices.

In this regard, the same holds true for the other vacuum evacuation means.

The first differential compartment 16 is provided downstream of the feed and take-up compartment 14 in the direction of travel of the substrate Z.

The first differential compartment 16 is defined by the inner wall 12a, the peripheral surface of the drum 30, and partition walls 36a and 36b extending from the inner wall 12a to the vicinity of the peripheral surface of the drum 30. The first differential compartment 16 includes an earth plate 48, a gas supply means 50, a vacuum evacuation means 52 and a control means 54.

The first differential compartment 16 provided between the feed and take-up compartment 14 and the film deposition compartment 18 contributes to preventing, in cases where the feed and take-up compartment 14 has a lower pressure than the film deposition compartment 18, deposition or formation of a film at unwanted positions in the feed and take-up compartment 14 and on the substrate Z due to penetration of gases into the film deposition compartment 18, and adverse effects of the pressure in the feed and take-up compartment 14 on the film deposition in the film deposition compartment 18 to be described later.

The earth plate 48 is an electrically conductive, grounded plate member which is disposed so as to face the drum 30 and suppresses in the first differential compartment 16 abnormal discharge from the drum 30.

By providing the earth plate 48, abnormal discharge from the drum 30 into the first differential compartment 16 can be suppressed to prevent plasma formation for film deposition (discharge) from destabilizing during the film deposition in the film deposition compartment 18 to be described later, whereby bias power can be supplied to the drum 30 to improve the film quality and the film deposition efficiency while preventing damage to the substrate Z and the film deposition device 10.

The earth plate 48 is preferably disposed in the first differential compartment 16 so as to face at least part of the peripheral surface of the drum 30 and more preferably the largest possible surface in accordance with the device configuration. Abnormal discharge from the drum 30 into the first differential compartment 16 can be thus more advantageously suppressed.

The distance between the earth plate 48 and the drum 30 is preferably up to 5 mm. Abnormal discharge from the drum 30 into the first differential compartment 16 can be more advantageously suppressed at a distance within the above-defined range.

In the present invention, the earth plate 48 is not particularly limited and may be formed from a conductive metal such as aluminum as long as abnormal discharge can be suppressed.

In this regard, the same holds true for the other earth plates.

The vacuum evacuation means 52 evacuates the first differential compartment 16. The gas supply means 50 is of a known type used in vacuum deposition devices such as plasma CVD devices and supplies a predetermined gas to the first differential compartment 16.

In the present invention, the gas supply means for supplying a gas to the differential compartment (means for introducing a gas to the differential compartment) supplies to the differential compartment a gas to be supplied to both of the adjacent two compartments, and/or an inert gas.

In the illustrated embodiment, the first differential compartment 16 is adjacent to the feed and take-up compartment 14 and the film deposition compartment 18. Since no gas is basically introduced into the feed and take-up compartment 14, the gas supply means 50 supplies to the first differential compartment 16 inert gases such as nitrogen gas, argon gas and helium gas.

In a preferred embodiment, the control means 54 controls the amount of air discharged by the vacuum evacuation means 52 and the amount of gas supplied from the gas supply means 50 so that the first differential compartment 16 may have a higher pressure than the adjacent film deposition compartment 18.

This point will be described later in further detail.

The film deposition compartment 18 is provided downstream of the first differential compartment 16.

The film deposition compartment 18 is defined by the inner wall 12*a*, the peripheral surface of the drum 30, and partition walls 36*b* and 36*e* extending from the inner wall 12*a* to the vicinity of the peripheral surface of the drum 30.

In the film deposition device 10, the film deposition compartment 18 carries out film deposition by capacitively coupled plasma-enhanced CVD (hereinafter abbreviated as "CCP-CVD") on the surface of the substrate Z and includes the shower head electrode 56, a material gas supply means 58, an RF power source 60, a vacuum evacuation means 62, and earth plates 90*a* and 90*b*.

The shower head electrode 56 is of a known type used in CCP-CVD.

In the illustrated case, the shower head electrode 56 is a film deposition electrode, for example, in the form of a hollow, substantially rectangular solid and is disposed so that its largest surface faces the peripheral surface of the drum 30. A large number of through holes are formed at the whole surface of the shower head electrode 56 facing the drum 30. The surface of the shower head electrode 56 facing the drum 30 may be curved so as to contour the peripheral surface of the drum 30. In the present invention, a film deposition space is defined as a space between the shower head electrode 56 which is a film deposition electrode and the peripheral surface of the drum 30 facing the shower head electrode 56.

In the illustrated embodiment, one shower head electrode (film deposition means using CCP-CVD) is provided in the film deposition compartment 18. However, this is not the sole case of the present invention and a plurality of shower head electrodes may be disposed in the direction of travel of the substrate Z. In this regard, the same holds true when using plasma-enhanced CVD of other type than CCP-CVD. For example, when an inorganic layer is formed by inductively coupled plasma-enhanced CVD (hereinafter referred to as "ICP-CVD"), a plurality of coils for forming an induced electric field (induced magnetic field) may be provided along the direction of travel of the substrate Z.

The present invention is not limited to the case in which the shower head electrode 56 is used, and a common electrode in plate form and a material gas supply nozzle may be used.

The material gas supply means 58 is of a known type used in vacuum deposition devices such as plasma CVD devices, and supplies a material gas into the shower head electrode 56.

As described above, a large number of through holes are formed at the surface of the shower head electrode 56 facing the drum 30. Therefore, the material gas supplied into the shower head electrode 56 passes through the through holes to be introduced into the space between the shower head electrode 56 and the drum 30.

The RF power source 60 is one for supplying plasma excitation power to the shower head electrode 56. Known RF power sources used in various plasma CVD devices may be all used for the RF power source 60.

In addition, the vacuum evacuation means 62 evacuates the film deposition compartment 18 to keep it at a predetermined film deposition pressure in order to form a gas barrier film by plasma-enhanced CVD.

The earth plates 90*a* and 90*b* are electrically conductive plate members disposed so as to face at least part of the peripheral surface of the drum 30 except the film deposition space, for example, the portion of the drum 30 facing the shower head electrode 56.

The earth plates 90*a* and 90*b* suppress abnormal discharge between the drum 30 and the film deposition compartment 18 except the shower head electrode 56 without impeding plasma formation or discharge between the drum 30 and the shower head electrode 56.

The earth plates 90*a* and 90*b* are preferably disposed in the film deposition compartment 18 so as to face at least part of the peripheral surface of the drum 30 and more preferably the largest possible surface in accordance with the device configuration. Abnormal discharge from the drum 30 into the film deposition compartment 18 can be thus more advantageously suppressed.

The distance between the earth plates 90*a* and 90*b*, and the drum 30 is preferably up to 5 mm. Abnormal discharge from the drum 30 into the film deposition compartment 18 can be more advantageously suppressed at a distance within the above-defined range.

In the present invention, the method of depositing a film in the CVD film forming compartment is not limited to the illustrated CCP-CVD and known CVD techniques including plasma-enhanced CVD such as ICP-CVD and microwave plasma CVD, catalytic CVD (Cat-CVD) and thermal CVD.

The film deposited in the CVD film forming compartment of the film deposition device of the present invention is not particularly limited and films that can be deposited by CVD may be all used. Particularly preferred examples of the film include gas barrier films made of silicon oxide, aluminum oxide and silicon nitride.

As described above, in the film deposition device 10, a bias potential is applied from the bias power source 28 to the drum 30 to improve the film density, thus enabling a high-quality film to be formed. The film deposition rate is also increased to improve the film deposition efficiency.

Application of a high bias potential to the drum (application of high electric power) in order to improve the film quality and film deposition efficiency causes discharge (abnormal discharge) from the drum in other areas than the film deposition area where film deposition is performed by plasma-enhanced CVD requiring discharge. The abnormal discharge from the drum destabilizes discharge in the film deposition area where discharge is necessary, that is, plasma generation, leading to a decrease in the quality of the film formed. Discharge from the drum may cause damage to the substrate Z or the film deposition device.

Abnormal discharge from the drum can be suppressed by providing electrically conductive, grounded earth plates in a face-to-face relationship with and in proximity to the drum as also shown in FIG. 1. However, no earth plate can be provided at the position at which the substrate starts to travel on the drum and the position at which the substrate separates from the drum, and abnormal discharge is difficult to avoid by the use of the earth plates. In addition, discharge due to static electricity generated by the contact between the substrate and the drum, so-called separating discharge due to static electricity generated by the separation of the substrate from the drum, and particularly abnormal discharge from the drum are likely to occur at these positions.

In this regard, according to the film deposition method of the present invention, as described above, the vacuum evacuation means 46 evacuates the feed and take-up compartment 14 such that the pressure in the feed and take-up compartment 14, that is, the pressure in the space containing the position at which the substrate Z starts to travel on the drum 30 and the position at which the substrate Z separates from the drum 30 may be lower than the pressure in the film deposition compartment 18. Abnormal discharge from the drum 30 into the feed and take-up compartment 14, that is, the space containing the position at which the substrate Z starts to travel on the drum 30 and the position at which the substrate Z separates from the drum 30 can be prevented to continuously deposit high-quality films with high efficiency while preventing damage to the substrate Z and the film deposition device 10.

In the present invention, the pressure in the feed and take-up compartment 14, that is, in the space containing the position at which the substrate Z starts to travel on the drum 30 and the position at which the substrate Z separates from the drum 30 is not particularly limited as long as it is lower than the pressure in the film deposition compartment 18. Abnormal discharge from the drum 30 into the feed and take-up compartment 14 can be thus advantageously suppressed to reduce the deterioration of the film quality and damage to the substrate Z due to the abnormal discharge. It is preferred that the pressure capable of suppressing abnormal discharge from the drum 30 to the position at which the substrate Z starts to travel on the drum 30 and the position at which the substrate Z separates from the drum 30 be appropriately set depending on the pressure in the film deposition compartment 18 (film deposition pressure) and the bias potential applied to the drum 30.

More specifically, the pressure in the feed and take-up compartment 14, that is, the pressure in the space containing the position at which the substrate Z starts to travel on the drum 30 and the position at which the substrate Z separates from the drum 30 is preferably up to one-tenth the pressure of the film deposition compartment 18. In addition, the pressure in the space containing the position at which the substrate Z starts to travel on the drum 30 and the position at which the substrate Z separates from the drum 30 is preferably up to 1 Pa. Abnormal discharge from the drum 30 into the feed and take-up compartment 14, that is, the space containing the position at which the substrate Z starts to travel on the drum 30 and the position at which the substrate Z separates from the drum 30 can be thus prevented more reliably.

Since not only the space containing the position at which the substrate Z starts to travel on the drum 30 and the position at which the substrate Z separates from the drum 30 in the feed and take-up compartment 14 but the whole of the feed and take-up compartment 14 has a lower pressure than the film deposition compartment 18, the illustrated embodiment can suppress abnormal discharge from the drum 30 into the feed and take-up compartment 14 and does not require disposing in the feed and take-up compartment 14 another earth plate for suppressing abnormal discharge from the drum 30 in addition to the earth plates 48, 90a and 90b.

The present invention may also be configured such that an earth plate for suppressing abnormal discharge from the drum 30 is disposed in the feed and take-up compartment 14. Even in cases where an earth plate is disposed in the feed and take-up compartment 14, the space containing the position at which the substrate Z starts to travel on the drum 30 and the position at which the substrate Z separates from the drum 30 where no earth plate can be disposed has a lower pressure than the film deposition compartment 18, and therefore abnormal discharge into the space can also be suppressed.

In addition, as described above, the film deposition device 10 is configured such that the first differential compartment 16 is provided between the feed and take-up compartment 14 and the film deposition compartment 18 serving as the CVD film forming compartment and in a preferred embodiment the first differential compartment 16 is kept at a higher pressure or at a lower degree of vacuum than the feed and take-up compartment 14 and film deposition compartment 18 adjacent thereto.

In such a device as in the illustrated embodiment in which the film deposition compartment performing plasma-enhanced CVD is separated from the feed and take-up compartment in a substantially air-tight manner and the feed and take-up compartment is kept at a low pressure, a gas in the film deposition compartment may enter the feed and take-up compartment to cause deposition or formation of a film at unwanted positions in the feed and take-up compartment and on the substrate.

A known method to solve such a defect involves providing a differential compartment between two compartments communicating with each other along the substrate travel path so that the differential compartment communicates with the two compartments and is separated therefrom in a substantially air-tight manner as also described in JP 2004-95677 A. A gas is usually prevented from entering the adjacent compartments by setting the internal pressure of the differential compartment lower than in the adjacent compartments as also described in JP 2004-95677 A. However, since the differential compartment has a lower pressure than the film deposition compartment, a material gas for use in CVD enters the differential compartment to deposit a film therein and therefore, maintenance is hard and workability is reduced.

In contrast, the present invention can prevent the gas in the film deposition compartment 18 from entering or penetrating into the feed and take-up compartment 14 and the first differential compartment 16 by keeping the first differential compartment 16 at a higher pressure than the adjacent compartments. Therefore, the material gas used for CVD does not enter the feed and take-up compartment 14 or the first differential compartment 16 to deposit or form a film therein.

The pressure in the first differential compartment 16 is set higher than that of the feed and take-up compartment 14 and the film deposition compartment 18. The gas supplied to the first differential compartment 16, that is, the gas entering the feed and take-up compartment 14 and the film deposition compartment 18 through the first differential compartment 16 is an inert gas and therefore does not cause adverse effects on the film deposition in the film deposition compartment 18, penetration of impurities into the film being formed, or contamination of the interior of the feed and take-up compartment 14 to adversely affect the substrate Z within the compartment.

In other words, by keeping the differential compartment at a higher pressure than that of the adjacent compartments, the film deposition device which carries out film deposition in the CVD film forming compartment as the substrate in strip form continuously travels in the longitudinal direction can prevent a gas in the CVD film forming compartment from entering other compartments to adversely affect the treatment or cause contamination, and also prevent penetration of a CVD reactive gas into the differential compartment, that is, film deposition in and contamination of the differential compartment.

An inert gas and/or a gas to be supplied to both the adjacent compartments is supplied to the differential compartment and therefore the supplied gas does not adversely affect the CVD film formation or the treatment in the treatment compartment.

According to the configuration of the present invention that the pressure in the feed and take-up compartment 14, that is, in the space containing the position at which the substrate Z starts to travel on the drum 30 and the position at which the substrate Z separates from the drum 30 is set lower than that of the film deposition compartment 18, the pressure in the feed and take-up compartment 14 may adversely affect the pressure in the film deposition compartment 18, that is, the film deposition pressure to reduce the quality of the film formed and the film deposition efficiency. In this regard, the first differential compartment 16 can be provided between the feed and take-up compartment 14 and the film deposition compartment 18 to suppress adverse effects of the pressure in the feed and take-up compartment 14 on the pressure in the film deposition compartment 18 and deterioration of the film quality and film deposition efficiency.

The second differential compartment 20 disposed between the film deposition compartment 18 and the feed and take-up compartment 14 has the same effect as the first differential compartment 16.

In cases where the pressure in the first differential compartment 16 is set higher than that in the feed and take-up compartment 14 and the film deposition compartment 18, there is no particular limitation on the difference between the pressure in the feed and take-up compartment 14 and the film deposition compartment 18, and the pressure in the first differential compartment 16 disposed therebetween as long as the pressure in the first differential compartment 16 is even a little higher than that in the adjacent compartments.

In other words, the pressure in the first differential compartment 16 should be appropriately set higher than that in the feed and take-up compartment 14 and the film deposition compartment 18 according to the pressure in the feed and take-up compartment 14 and the film deposition compartment 18, the difference between the pressure of the feed and take-up compartment 14 and that of the film deposition compartment 18, and the capacity of the vacuum evacuation means disposed in the feed and take-up compartment 14 and the film deposition compartment 18 so as not to adversely affect the pressure in the feed and take-up compartment 14 and the film deposition compartment 18 and so as to minimize adverse effects if any.

The film deposition pressure in CVD is usually from several Pa to several hundred Pa and therefore the first differential compartment 16 (differential compartment) preferably has a higher pressure by at least 5 Pa than the film deposition compartment 18.

Such a layout enables the first differential compartment 16 to separate the feed and take-up compartment 14 and the film deposition compartment 18 from each other while more reliably preventing the gas in the film deposition compartment 18 from entering the first differential compartment 16, and is therefore preferred.

Because the adverse effect of the pressure in the differential compartment on the pressure in its adjacent compartments can be minimized, the difference between the pressure in the first differential compartment 16 and that in the film deposition compartment 18 is preferably 10 Pa or less.

When the pressure in the first differential compartment 16 is higher than that in the film deposition compartment 18 and does not adversely affect the pressure in the adjacent compartments, abnormal discharge from the drum 30 into the first differential compartment 16 may easily occur.

In this regard, as described above, even in cases where the first differential compartment 16 is kept at a pressure easily causing discharge, the earth plate 48 disposed so as to face the drum 30 enables abnormal discharge from the drum 30 to be suppressed and prevents plasma formation for film deposition from destabilizing, as a result of which bias power can be supplied to the drum 30 to improve the film quality and the film deposition efficiency while preventing damage to the substrate Z and the film deposition device 10.

In this regard, the same holds true for the second differential compartment 20.

When the pressure in the differential compartment is set higher than that in the adjacent compartments, the gas in the differential compartment enters the feed and take-up compartment adjacent thereto. Even if the pressure in the feed and take-up compartment is set lower than that in the film deposition compartment to prevent abnormal discharge from the drum, the gas entering the feed and take-up compartment from the differential compartment increases the pressure in the vicinity of the opening of the feed and take-up compartment through which the substrate passes, that is, the pressure in the space containing the position at which the substrate starts to travel on the drum and the position at which the substrate separates from the drum. There still occurs abnormal discharge between the drum and the guide rollers to cause damage to the substrate. Plasma formation for film deposition in the film deposition compartment is destabilized to reduce the film quality or cause damage to the film deposition device.

In this regard, as described above, the present invention evacuates the feed and take-up compartment 14 so that the space containing the position at which the substrate Z starts to travel on the drum 30 and the position at which the substrate Z separates from the drum 30 may have a lower pressure than the film deposition compartment 18, and can therefore prevent abnormal discharge from the drum 30 into the feed and take-up compartment 14, that is, the space containing the position at which the substrate Z starts to travel on the drum 30 and the position at which the substrate Z separates from the drum 30. High-quality films can be thus continuously deposited with high efficiency while also preventing damage to the substrate Z and the film deposition device 10.

The second differential compartment 20 is provided downstream of the film deposition compartment 18.

The second differential compartment 20 is defined by the inner wall 12a, the peripheral surface of the drum 30, and partition walls 36e and 36f extending from the inner wall 12a to the vicinity of the peripheral surface of the drum 30.

The second differential compartment 20 includes a gas supply means 64, an earth plate 66, a vacuum evacuation means 68 and a control means 70. As in the first differential compartment 16, the vacuum evacuation means 68 evacuates the second differential compartment 20, the gas supply means 64 is of a known type supplying a predetermined gas to the second differential compartment 20 and the earth plate 66 suppresses discharge from the drum 30 into the second differential compartment 20.

The second differential compartment 20 is provided between the feed and take-up compartment 14 and the film deposition compartment 18 and therefore the gas supply means 64 supplies an inert gas to the second differential compartment 20 as in the above-described gas supply means 50.

As in the above-described control means 54, the control means 70 controls the evacuation made by the vacuum evacuation means 68 and the amount of gas supplied from the gas supply means 64 so that the internal pressure of the second differential compartment 20 may be higher than that of the feed and take-up compartment 14 and the film deposition compartment 18.

The operation of the film deposition device 10 is described below.

As described above, upon mounting of the substrate roll 32 on the rotary shaft 42, the substrate Z is let out from the substrate roll 32 and is passed along the predetermined travel path including the guide roller 40a, the drum 30 and the guide roller 40b to reach the take-up shaft 34.

Once the substrate Z has been passed through the travel path, the vacuum chamber 12 is closed and the vacuum evacuation means 46, 52, 62 and 68 are driven to start evacuation of the respective compartments.

Once the feed and take-up compartment 14, the first differential compartment 16, the film deposition compartment 18, and the second differential compartment 20 have been all evacuated to predetermined degrees of vacuum or higher, the gas supply means 50 and 64 are driven to introduce predetermined gases to the respective differential compartments, and the material gas supply means 58 is driven to supply the material gases to the film deposition compartment 18.

The pressure in the feed and take-up compartment 14 is lower than that in the film deposition compartment 18 and is preferably up to one-tenth the pressure in the film deposition compartment 18 or up to 1 Pa. As described above, the control means 54 and 70 adjust the pressure in the first differential compartment 16 and the second differential treatment 20 so that the first differential compartment 16 may have a higher pressure than the feed and take-up compartment 14 and the film deposition compartment 18, and the second differential compartment 20 may also have a higher pressure than the film deposition compartment 18 and the feed and take-up compartment 14.

As also described above, an inert gas is supplied to the first differential compartment 16 and the second differential compartment 20.

Once the pressure in all the compartments has stabilized at predetermined values, the rotation of the drum 30 is started to start traveling of the substrate Z and the bias power source 28 and the RF power source 60 are driven to start film deposition on the substrate Z in the film deposition compartment 18 as the substrate Z travels in the longitudinal direction.

As described above, the present invention uses the vacuum evacuation means 46 to evacuate the feed and take-up compartment 14 so that the feed and take-up compartment 14, that is, the space containing the position at which the substrate Z starts to travel on the drum 30 and the position at which the substrate Z separates from the drum 30 may have a lower pressure than the film deposition compartment 18, and can therefore prevent abnormal discharge from the drum 30 into the feed and take-up compartment 14, that is, the space containing the position at which the substrate Z starts to travel on the drum 30 and the position at which the substrate Z separates from the drum 30 even under application of a bias potential to the drum 30. The film quality is thus prevented from being reduced by abnormal discharge to enable high-quality films to be continuously deposited with high efficiency. Damage to the substrate Z and the film deposition device 10 can be also prevented from occurring.

The present invention includes the differential compartments 16 and 20 between the feed and take-up compartment 14 and the film deposition compartment 18, and in a preferred embodiment an inert gas is introduced into the differential compartments 16 and 20 so that the differential compartments 16 and 20 may have a higher pressure than the adjacent compartments.

Therefore, the gas in the film deposition compartment 18 does not enter the feed and take-up compartment 14 and the contamination of the feed and take-up compartment 14 and of the substrate Z before and after the film deposition can be prevented from occurring. The gas in the film deposition compartment 18 also does not enter the differential compartments 16 and 20 and the contamination of the differential compartments 16 and 20, and the deposition or formation of a film therein can also be prevented from occurring. Even if the gas in the differential compartments 16 and 20 enters the feed and take-up compartment 14, abnormal discharge from the drum 30 into the feed and take-up compartment 14 can be prevented from occurring because the space containing the position at which the substrate Z starts to travel on the drum 30 and the position at which the substrate Z separates from the drum 30 has a lower pressure than the film deposition compartment 18.

In a preferred embodiment of the present invention, the film deposition compartment 18, the first differential compartment 16 and the second differential compartment 20 include the earth plates 90a and 90b, 48, and 66 disposed so as to face the drum 30, respectively. Not only abnormal discharge in the feed and take-up compartment 14 but also abnormal discharge in the whole of the drum 30 can be thus prevented from occurring by disposing the earth plates 48, 66, 90a and 90b so as to face the drum 30.

In a preferred embodiment of the illustrated film deposition device 10, the pressure in the differential compartments 16 and 20 are set higher than that in the adjacent feed and take-up compartment 14 and film deposition compartment 18. However, this is not the sole case of the present invention and the differential compartments may have a lower pressure than the film deposition compartment. Alternatively, the differential compartment may have a lower pressure than the feed and take-up compartment and the film deposition compartment, or have the same pressure as the feed and take-up compartment or the film deposition compartment.

By providing the differential compartments between the feed and take-up compartment and the film deposition compartment, the gas in the film deposition compartment can be prevented from entering the feed and take-up compartment to deposit a film at unwanted positions in the feed and take-up compartment and on the substrate Z. According to the configuration of the present invention that the pressure in the feed and take-up compartment is set lower than that of the film deposition compartment, the pressure in the feed and take-up compartment may adversely affect the pressure in the film deposition compartment, that is, the film deposition pressure. However, adverse effects of the pressure in the feed and take-up compartment on the pressure in the film deposition compartment and reduction of the film quality and film deposition efficiency can be suppressed by providing the differential compartments between the feed and take-up compartment and the film deposition compartment.

The illustrated embodiment includes the CVD film forming compartment, the two differential compartments and the feed and take-up compartment. However, the film deposition device of the present invention is not limited to this but may include two or more CVD film forming compartments. The space containing the position at which the substrate Z starts to travel on the drum and the position at which the substrate Z separates from the drum preferably has a lower pressure than one of the CVD film forming compartments which has the lowest pressure.

In cases where the film deposition device includes a plurality of CVD film forming compartments, a differential compartment is preferably provided between adjacent CVD film forming compartments, and this differential compartment more preferably has a higher pressure than the adjacent CVD film forming compartments as in the above case.

Figure 3:
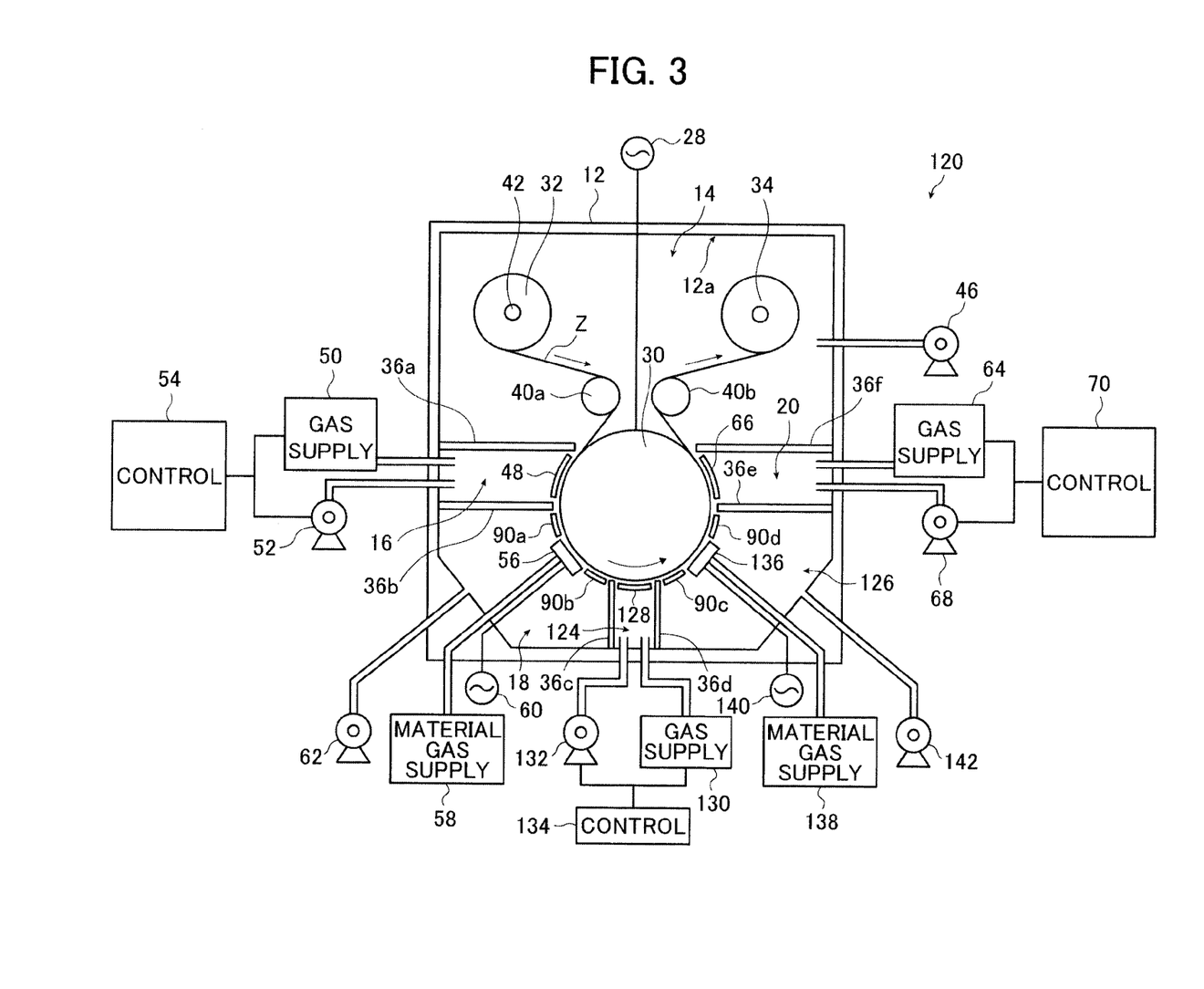
FIG. 3 is a schematic view showing another embodiment of the film deposition device for implementing the film deposition method of the present invention.

FIG. 3 is a schematic view showing another embodiment of the film deposition device for implementing the film deposition method of the present invention. Since a film deposition device 120 shown in FIG. 3 is configured in the same manner as the film deposition device 10 in FIG. 1 except the former device includes a third differential compartment 124 and a second film deposition compartment 126 between the film deposition compartment 18 and the second differential compartment 20, like elements are denoted by the same reference numerals and the following description mainly focuses on the distinctive portions.

The third differential compartment 124 is provided downstream of the film deposition compartment 18.

The third differential compartment 124 is defined by the inner wall 12a, the peripheral surface of the drum 30, and partition walls 36c and 36d extending from the inner wall 12a to the vicinity of the peripheral surface of the drum 30.

The third differential compartment 124 includes a gas supply means 130, an earth plate 128, a vacuum evacuation means 132 and a control means 134 as in the first differential compartment 20.

The third differential compartment 124 is provided between the film deposition compartment 18 and the second film deposition compartment 126 and therefore the gas supply means 130 supplies to the third differential compartment 124 an inert gas and/or a gas to be supplied to both of the film deposition compartment 18 and the second film deposition compartment 126.

The control means 134 controls the evacuation made by the vacuum evacuation means 132 and the amount of gas supplied from the gas supply means 130 so that the internal pressure of the third differential compartment 124 may be higher than that of the film deposition compartment 18 and the second film deposition compartment 126.

The second film deposition compartment 126 is provided downstream of the third differential compartment 124.

The second film deposition compartment 126 is defined by the inner wall 12a, the peripheral surface of the drum 30, and partition walls 36d and 36e.

As in the film deposition compartment 18, the second film deposition compartment 126 carries out film deposition by CCP-CVD on the substrate Z or the substrate Z having a film deposited in the film deposition compartment 18.

The second film deposition compartment 126 includes a shower head electrode 136, a material gas supply means 138, an RF power source 140, a vacuum evacuation means 142, and earth plates 90c and 90d as in the film deposition compartment 18.

The film deposited in the second film deposition compartment 126 may be the same as or different from the film deposited in the film deposition compartment 18.

When the pressure in the second film deposition compartment 126 are set lower than that in the film deposition compartment 18, the space containing the position at which the substrate Z starts to travel on the drum and the position at which the substrate Z separates from the drum preferably has a lower pressure than that in the second film deposition compartment 126. When the pressure in the film deposition compartment 18 are set lower than that in the second film deposition compartment 126, the space containing the position at which the substrate Z starts to travel on the drum and the position at which the substrate Z separates from the drum preferably has a lower pressure than that in the film deposition compartment 18.

Even in such a configuration that the film deposition device includes two or more CVD film forming compartments, the feed and take-up compartment 14 is evacuated so that the space containing the position at which the substrate Z starts to travel on the drum 30 and the position at which the substrate Z separates from the drum 30 may have a lower pressure than one of the CVD film forming compartments which has the lowest pressure to thereby prevent abnormal discharge from the drum 30 into the feed and take-up compartment 14.

A feed compartment for feeding the substrate Z from the substrate roll and a take-up compartment for winding up the substrate Z after the film deposition may be provided as separate entities.

The film deposition device 10 in the illustrated embodiment is configured such that the feed and take-up compartment 14 includes the rotary shaft 42 for feeding the substrate Z from the substrate roll 32, the take-up shaft 34 for winding up the substrate Z after the film deposition, the position at which the substrate Z starts to travel on the drum 30 and the position at which the substrate Z separates from the drum 30. However, the present invention is not limited to this but may be configured such that the rotary shaft and the take-up shaft are disposed in a compartment separate from that containing the position at which the substrate Z starts to travel on the drum 30 and the position at which the substrate Z separates from the drum 30.

In other words, various configurations may be used in the present invention as long as the space containing the position at which the substrate Z starts to travel on the drum and the position at which the substrate Z separates from the drum has a lower pressure than the film deposition compartment.

Figure 2:
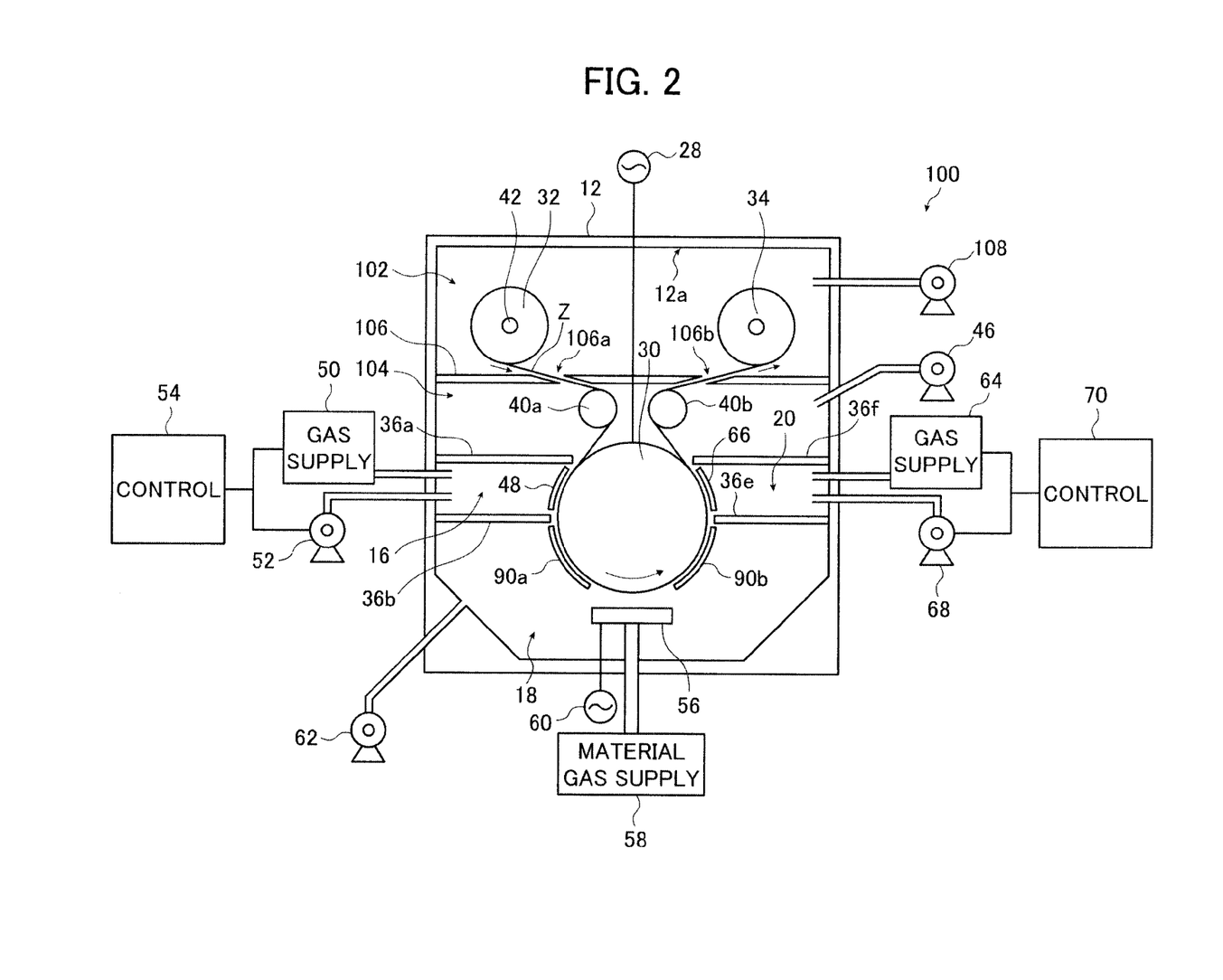
FIG. 2 is a schematic view showing another embodiment of the film deposition device for implementing the film deposition method of the present invention.

FIG. 2 is a schematic view showing another embodiment of the film deposition device for implementing the film deposition method of the present invention. Since a film deposition device 100 shown in FIG. 2 is configured in the same manner as the film deposition device 10 in FIG. 1 except the former device includes a feed and take-up compartment 102 and a wrapping compartment 104 instead of the feed and take-up compartment 14, like elements are denoted by the same reference numerals and the following description mainly focuses on the distinctive portions.

The feed and take-up compartment 102 is defined by an inner wall 12a and a partition wall 106.

The partition wall 106 is disposed between a rotary shaft 42 and a take-up shaft 34 on one hand, and guide rollers 40a and 40b on the other hand. The partition wall 106 has a slit 106a through which the substrate Z passes during its travel from the rotary shaft 42 to the guide roller 40a, and a slit 106b through which the substrate Z passes during its travel from the guide roller 40b to the take-up shaft 34. The slits 106a and 106b are of a size capable of passing the substrate Z therethrough and separating the feed and take-up compartment 102 and the wrapping compartment 104 from each other in a substantially air-tight manner.

The feed and take-up compartment 102 includes the take-up shaft 34, the rotary shaft 42 and a vacuum evacuation means 108.

The vacuum evacuation means 108 evacuates the feed and take-up compartment 102 to reduce the pressure to a predetermined degree of vacuum. The feed and take-up compartment 102 should have a pressure that may not adversely affect the pressure in the wrapping compartment 104. The feed and take-up compartment 102 may not have the vacuum evacuation means 108 as long as the pressure in the wrapping compartment 104 is not adversely affected.

The wrapping compartment 104 is defined by the inner wall 12a of a vacuum chamber 12, the peripheral surface of a drum 30, partition walls 36a and 36f, and the partition wall 106.

The wrapping compartment 104 includes the space containing the position at which the substrate Z starts to travel on the drum 30 and the position at which the substrate Z separates from the drum 30. In other words, the substrate Z is brought in contact with the drum 30 and is separated from the drum 30 in the wrapping compartment 104.

The wrapping compartment 104 includes the guide rollers 40a and 40b, and a vacuum evacuation means 46.

The vacuum evacuation means 46 evacuates the wrapping compartment 104 so that the wrapping compartment 14, that is, the space containing the position at which the substrate Z starts to travel on the drum 30 and the position at which the substrate Z separates from the drum 30 may have a lower pressure than a film deposition compartment 18 to prevent abnormal discharge from the drum 30 into the wrapping compartment 104.

Even in such a configuration that the feed and take-up compartment 102 includes the rotary shaft 42 for feeding the substrate Z from the substrate roll 32 and the take-up shaft 34 for winding up the substrate Z after the film deposition, whereas the wrapping compartment 104 includes the position at which the substrate Z starts to travel on the drum 30 and the position at which the substrate Z separates from the drum 30, the wrapping compartment 104 is evacuated so that the space containing the position at which the substrate Z starts to travel on the drum 30 and the position at which the substrate Z separates from the drum 30 may have a lower pressure than the film deposition compartment 18 to thereby prevent abnormal discharge from the drum 30 into the wrapping compartment 104, thus enabling high-quality films to be continuously deposited with high efficiency while preventing damage to the substrate Z and the film deposition device 100.

In the film deposition device 100 shown in FIG. 2, the guide rollers 40a and 40b are disposed in the wrapping compartment 104. However, this is not the sole case of the present invention and the guide rollers 40a and 40b may be disposed in the feed and take-up compartment 102. In other words, the film deposition device 100 may be configured such that the partition wall 106 separating the feed and take-up compartment 102 from the wrapping compartment 104 may be provided between the drum 30 and the guide rollers 40a, 40b.

In the foregoing embodiments, the shower head electrode forms an electrode pair with the drum and plasma excitation power and bias power are supplied to the shower head electrode and the drum, respectively. However, this is not the sole case of the present invention and plasma excitation power may be supplied to the drum to perform film deposition by ICP-CVD.

In the present invention, the film deposition process is not limited to plasma-enhanced CVD and various film deposition processes including sputtering may be used.

In other words, various film deposition processes and film deposition devices may be all employed in the present invention as long as film deposition is performed on a substrate in strip form traveling on a drum and supported by the peripheral surface of the drum as electric power is supplied to the drum.

In particular, plasma-enhanced CVD may easily cause abnormal discharge due to the high pressure or low degree of vacuum during the film deposition. Therefore, the present invention capable of suppressing abnormal discharge can be more advantageously applied to the plasma CVD.

While the film deposition device for implementing the film deposition method of the present invention has been described above in detail, the present invention is by no means limited to the foregoing embodiment and it should be understood that various improvements and modifications are possible without departing from the scope and spirit of the present invention.

EXAMPLES

Next, the present invention is described in further detail by referring to the Examples.

Example 1

The film deposition device 10 shown in FIG. 1 was used to deposit a silicon nitride film on a substrate Z.

The substrate Z used was a PET film (Cosmoshine A4300 available from Toyobo Co., Ltd.).

Silane gas (at a flow rate of 100 sccm), ammonia gas (at a flow rate of 100 sccm) and nitrogen gas (at a flow rate of 800 sccm) were used as the material gases to form the silicon nitride film by means of CCP-CVD. The gas used to supply to the differential compartments 16 and 20 was nitrogen gas (at a flow rate of 800 sccm).

The film deposition pressure in the film deposition compartment 18, the pressure in the first differential compartment 16 and the second differential compartment 20, and the pressure in the feed and take-up compartment 14 were set to 50 Pa, 60 Pa and 5 Pa, respectively.

An RF power source at a frequency of 13.56 MHz was used for the RF power source 60 and the plasma excitation power to be supplied to the shower head electrode 56 was set to 1 kW.

A power source at a frequency of 13.56 Hz was used for the bias power source 28 and the bias power to be supplied to the drum 30 was set to 300 W.

Under such conditions, the silicon nitride film was deposited on the substrate Z with a length of 1000 m in the film deposition device 10. The inside of the feed and take-up compartment 14 was visually checked during the film deposition and no abnormal discharge could be confirmed in the feed and take-up compartment 14 from the start of the film deposition until the end of the film deposition on the length of 1000 m. This case was rated as good in the evaluation to be mentioned below. The inside of the two differential compartments 16 and 20 was visually checked after the end of the film deposition and as a result no film was deposited at all. This case was rated as good in the evaluation to be mentioned below.

Comparative Example 1

Example 1 was repeated except that the amounts of evacuation of the feed and take-up compartment and the differential compartments were adjusted by the vacuum evacuation means to set the pressure in the feed and take-up compartment at 50 Pa and the pressure in the first and second differential compartments at 10 Pa, thereby depositing a silicon nitride film on a substrate Z with a length of 1000 m. Then, the inside of the feed and take-up compartment and the two differential compartments were visually checked and evaluated. As a result, occurrence of abnormal discharge in the feed and take-up compartment could be confirmed. This case was rated poor in the evaluation to be mentioned below. Film deposition was confirmed in the two differential compartments. This case was rated poor in the evaluation to be mentioned below.

The evaluation criteria for the abnormal discharge in the feed and take-up compartment were as follows:

The case in which no abnormal discharge was confirmed in the feed and take-up compartment was rated good; and the case in which abnormal discharge was confirmed in the feed and take-up compartment was rated poor.

The evaluation criteria for the film deposition in the differential compartments were as follows:

The case in which film deposition was not confirmed at all in all of the differential compartments was rated good; and the case in which film deposition was confirmed in at least one of the differential compartments was rated poor.

The pressure in each compartment and evaluation results are shown in Table 1 below.

TABLE 1

| | Pressure in film deposition compartment Pa | Pressure in feed and take-up compartment Pa | Pressure in first differential compartment Pa | Pressure in second differential compartment Pa | Discharge in feed and take-up compartment | Deposition in differential compartments |
|---|---|---|---|---|---|---|
| EX1 | 50 | 5 | 60 | 60 | Good | Good |
| CE1 | 50 | 50 | 10 | 10 | Poor | Poor |

As is seen from Table 1, the present invention is capable of suppressing abnormal discharge in the feed and take-up compartment and continuously depositing high-quality films with high efficiency while preventing damage to the substrate Z and the film deposition device. The present invention can also considerably improve the workability and the ease of maintenance of the film deposition device while considerably reducing film deposition in the differential compartments.

The above results clearly show the beneficial effects of the present invention.

The present invention can considerably improve the film quality and film deposition efficiency and be therefore advantageously used to produce gas barrier films.

What is claimed is:

1. A film deposition method in which a film is deposited on a surface of a substrate in strip form traveling on a peripheral surface of a cylindrical drum, in at least one film deposition compartment which contains a space defined by a peripheral surface of said drum, the method comprising the steps of:

in a system with a differential compartment disposed between said at least one film deposition compartment and a compartment including a wrapping space, setting a first pressure of said wrapping space lower than a second pressure of said at least one film deposition compartment, said wrapping space containing at least one of a first position at which said substrate starts to travel on said drum and a second position at which said substrate separates from said drum, said differential compartment communicating with said compartment including the wrapping space and said at least one film deposition compartment;

setting a third pressure of said differential compartment higher than the second pressure of said at least one film deposition compartment; and performing film deposition in said at least one film deposition compartment, with electric power supplied to said drum.

2. The film deposition method according to claim 1, wherein said wrapping space contains both of the first position at which said substrate starts to travel on said drum and the second position at which said substrate separates from said drum.

3. The film deposition method according to claim 1, wherein earth plates which comprise electrically conductive, grounded plates are disposed in said at least one film deposition compartment so as to face at least part of the peripheral surface of said drum except a film deposition space.

4. The film deposition method according to claim 1, wherein earth plates which comprise electrically conductive, grounded plates are disposed in said differential compartments so as to face at least part of the peripheral surface of said drum.

5. The film deposition method according to claim 1, wherein an inert gas is introduced into said differential compartment.

6. The film deposition method according to claim 1, wherein the film is deposited on said substrate by CVD in said at least one film deposition compartment.

7. The film deposition method according to claim 1, wherein the first pressure of said wrapping space is up to one-tenth the second pressure of said at least one film deposition compartment.

8. The film deposition method according to claim 1, wherein the first pressure of said wrapping space is up to 1 Pa.

9. The film deposition method according to claim 1,
further comprising at least one of guide rollers for making said substrate travel on a predetermined travel path,
wherein a space between said at least one of guide rollers and said drum, including said wrapping space has a lower pressure than said at least one film deposition compartment.

10. The film deposition method according to claim 9,
further comprising a wrapping compartment including said at least one of guide rollers and said space between said at least one of guide rollers and said drum,
wherein said wrapping compartment is said compartment including said wrapping space, and
said wrapping compartment has a lower pressure than said at least one film deposition compartment.

11. The film deposition method according to claim 1,
further comprising a substrate roll for feeding said substrate, a take-up roll for winding up said substrate after the film deposition, two guide rollers respectively disposed between said substrate roll and said drum and between said take-up roll and said drum, for making said substrate travel on a predetermined travel path, and a feed and take-up compartment including said substrate roll, said take-up roll, said two guide rollers,
wherein said feed and take-up compartment is said compartment including said wrapping space, and
said feed and take-up compartment has a lower pressure than said at least one film deposition compartment.

12. The film deposition method according to claim 1, wherein said at least one film deposition compartment comprises a plurality of film deposition compartments, and the first pressure of said wrapping space is lower than one of said plurality of film deposition compartments which has the lowest pressure.

* * * * *